US008664650B2

(12) United States Patent
Hild et al.

(10) Patent No.: US 8,664,650 B2
(45) Date of Patent: Mar. 4, 2014

(54) ARRANGEMENT COMPRISING OPTICALLY TRANSPARENT AND/OR FUNCTIONAL COMPONENTS

(71) Applicant: Fraunhofer-Gesellschaft zur Foerderung der angewandten Forschung e.V., Munich (DE)

(72) Inventors: Olaf R. Hild, Radebeul (DE); Beatrice Beyer, Dresden (DE); Dirk Schlebusch, Dresden (DE); Susan Richter, Dresden (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 13/719,641

(22) Filed: Dec. 19, 2012

(65) Prior Publication Data
US 2013/0175511 A1    Jul. 11, 2013

(30) Foreign Application Priority Data
Dec. 20, 2011    (DE) .................... 10 2011 122 475

(51) Int. Cl.
*H01L 29/08*    (2006.01)
*H01L 35/24*    (2006.01)
*H01L 51/00*    (2006.01)
*H01L 29/22*    (2006.01)
*H01L 33/00*    (2010.01)

(52) U.S. Cl.
USPC .. 257/40; 257/99; 257/E33.058; 257/E33.062

(58) Field of Classification Search
USPC .................. 257/40, 99, E33.058, E33.062
See application file for complete search history.

(56) References Cited

U.S. PATENT DOCUMENTS

| | | | | |
|---|---|---|---|---|
| 5,965,907 A * | 10/1999 | Huang et al. | ..................... | 257/89 |
| 6,693,296 B1 * | 2/2004 | Tyan | ................................ | 257/40 |
| 6,885,030 B2 * | 4/2005 | Onozuka et al. | ................ | 257/66 |
| 7,034,470 B2 * | 4/2006 | Cok et al. | ....................... | 315/249 |
| 7,327,081 B2 * | 2/2008 | Lo et al. | ......................... | 313/506 |
| 7,375,464 B2 * | 5/2008 | Chin et al. | ..................... | 313/506 |

(Continued)

FOREIGN PATENT DOCUMENTS

| | | |
|---|---|---|
| EP | 1 388 894 A2 | 2/2004 |
| WO | WO 2009/154288 A1 | 12/2009 |
| WO | WO 2011/146915 A1 | 11/2011 |

OTHER PUBLICATIONS

Chengzhang Wu et al., "LiNH2BH3 3NH3BH3: Structure and Hydrogen Storage Properties", Chemistry of Materials Communication, 2010, vol. 22, pp. 3-5.

*Primary Examiner* — Ida M Soward
(74) *Attorney, Agent, or Firm* — Jacobson Holman PLLC (57) ABSTRACT

The invention relates to an arrangement including optically transparent and/or functional components. It is desirable for many applications to achieve a high functionality and variability in the utilization of electronic components over a very small area or with a small space requirement for such a design. In an arrangement in accordance with the invention, an organic electronic component and at least one further organic or inorganic electronic component are arranged layer-wise, stacked over one another, on a substrate. In this respect, planar electrically conductive electrodes at the surfaces of the components are formed such that the components are electrically connected in series and the components are each individually electrically controllable via the electrodes in accordance with their polarities.

12 Claims, 5 Drawing Sheets

(56) References Cited

U.S. PATENT DOCUMENTS

| | | |
|---|---|---|
| 7,474,061 B2 * | 1/2009 | Oh et al. .................... 315/169.3 |
| 8,173,460 B2 * | 5/2012 | Cok ................................ 438/34 |
| 8,222,096 B2 * | 7/2012 | Nomoto ........................ 438/158 |
| 8,366,505 B2 * | 2/2013 | Yeh et al. ........................ 445/25 |
| 8,395,316 B2 * | 3/2013 | Nagayama et al. ........... 313/506 |
| 8,415,230 B2 * | 4/2013 | Yonehara et al. ............. 438/458 |
| 2003/0218191 A1 * | 11/2003 | Nordal et al. ................. 257/200 |
| 2006/0091794 A1 | 5/2006 | Agostinelli et al. |
| 2009/0151776 A1 * | 6/2009 | Schindler ...................... 136/251 |
| 2010/0076527 A1 | 3/2010 | Hammond et al. |
| 2011/0127906 A1 * | 6/2011 | Mitsuya et al. ............... 313/504 |
| 2011/0163337 A1 * | 7/2011 | Shiang et al. ................... 257/98 |
| 2012/0019124 A1 * | 1/2012 | Hente ........................... 313/498 |

\* cited by examiner

Fig. 5

ARRANGEMENT COMPRISING OPTICALLY TRANSPARENT AND/OR FUNCTIONAL COMPONENTS

BACKGROUND OF THE INVENTION

This application has a priority of German no. 10 2011 122 475.4 filed Dec. 20, 2011, hereby incorporated by reference.

The invention relates to an arrangement comprising optically transparent and/or functional components. It is desirable for many applications to achieve a high functionality and variability in the utilization of electronic components over a very small area or with a small space requirement for such a design. This is in particular meaningful with optical components. In this respect, however, there are limits due to the possibility of the density of an arrangement of such components next to one another which require a specific spacing of the components arranged next to one another which can naturally not be utilized.

In optical applications, however, an arrangement of components stacked over one another also presents problems, which in particular has a disadvantageous effect with components having different functionalities stacked over one another. In this respect, deficits are present on a common use, or optionally on a desired sequential use, of the different functionalities of the components.

A design is described in EP 1 388 894 A2, for instance, in which two or three organic light-emitting diodes are configured over one another in stacked form. Each organic light-emitting diode is in this respect bordered by two electrodes. These electrodes in this respect only form the electrically conductive connection of the organic light-emitting diodes electrically connected in parallel. An independent operation of these organic light-emitting diodes stacked in this manner is possible.

The organic light-emitting diodes in this respect have a PIN-NIP junction behavior.

SUMMARY OF THE INVENTION

It is therefore the object of the invention to provide possibilities in which electronic components are arranged on a small space and with a small space requirement and their functionalities can be utilized variably, with the effort for the manufacture and operation being kept small.

This object is achieved in accordance with the invention by an arrangement having the features as set forth in the attached claims.

In the arrangement in accordance with the invention, optically transparent and/or functional components are present. In this respect, an organic electronic component and at least one further organic or inorganic electronic component are arranged layer-wise, stacked over one another, on a substrate. Planar electrically conductive electrodes of the components are formed at the surfaces of the components so that the components arranged vertically above one another on the substrate (z axis) are connected electrically in series and the electrodes can each be individually electrically controlled and in so doing can be individually switched on and off. The individual components stacked directly over one another can be controlled independently of one another and can be operated accordingly by this variable control possibility of the respective outer electrodes. Only one common electrode should be formed between the two components which can be used for the two components. The two respective other electrodes of the components arranged over one another should each have the same polarity which is opposite to the polarity of the common electrode of these two components.

The manufacturing effort can thereby be reduced. With electrodes which should be optically transparent, this likewise has a favorable effect since only boundaries to the two components are present and no further boundary to a further electrode is present.

In addition, with a common electrode formed between two components arranged above one another on the substrate, components arranged on the substrate in the same way next to one another (x axis and/or y axis) can also be connected electrically in series.

There is the possibility in accordance with the invention to operate components arranged over one another independently of one another so that either a component which is arranged beneath a component or a component which is arranged above a component is actively operated by an applied electric voltage.

With the components connected electrically in series, either the components arranged beneath the common electrode or the components arranged above the common electrode can be actively operated by an applied electric voltage. The common electrode can be an element of the respective component.

The distinguishing of which component should be operated, that is above or beneath, takes place via the choice of the polarities of the electrodes.

There is the possibility in the invention to supply a component with an electrical current via two electrodes connected to the component with a suitable electric voltage so that, for example, a light-emitting diode emits light, whereas a further component present in the stack can remain switched off. In this respect, one component is operated in the forward direction and the second component is operated in the reverse direction simultaneously by an electric current likewise supplied via the two electrodes present at this component.

There is, however, also the possibility of, for example, using an organic light-emitting diode or an inorganic light-emitting diode having an organic or inorganic photovoltaic element or such a photosensor in a stack of components having different functionalities. In this respect, however, an organic electronic component should always be present in the stack.

In this case, an electrical voltage take-up can take place at the two electrodes of a photovoltaic element or photosensor, with its electrical voltage value and/or the respective electrical current being able to be used as a measurement signal. A regulation or control of the operation of the light-emitting diode can then advantageously take place with the aid of this measurement signal, with the light-emitting diode either being able to be switched on on an exceeding or falling below of a threshold of the detected measurement signal by application of an electrical voltage to its electrodes or a regulation of the light-emitting diode being able to be achieved by means of the determine magnitude of the measurement signal. With a reduced environmental brightness, for example, less light can thus be emitted than is the case with increasing darkness up to full darkness. This technique can be used, for example, for the illumination of displays, particularly advantageously in cell phones. A photovoltaic element and a light-emitting diode, as an element emitting electromagnetic radiation, are operated independently of one another in time, with either the photovoltaic element or the element emitting electromagnetic radiation being actively operated.

The electronic components stacked above one another should have a PIN-NIP or NIP-PIN junction behavior and the function of corresponding diodes. An independent utilization of the individual electronic components within a stack can thereby be reliably ensured.

An organic electronic component which can be used with the invention can be selected from organic light-emitting elements (OLEDs), organic photovoltaic elements (OPVs), organic photosensors (OPS), organic thermal elements, electrochromic elements and elements for electrowetting.

Analog to this, an inorganic electronic component can be selected from inorganic light-emitting elements, inorganic photovoltaic elements, inorganic photosensors, thermal elements and LCDs. It should thereby be defined here what is to be understood under organic and inorganic electronic components which can be used with the invention.

As already addressed, one or more electrodes and/or the substrate can be optically transparent. The electrodes can in this respect be formed from electrically conductive oxides such as indium tin oxide, ZnAlO, indium zinc oxide, FTO or tin oxide (examples for TCOs) or from a metal or a metal alloy as well as from suitable carbon modifications (graphene, carbon nanotubes or also synthetic metals). With electrodes of metal, the optical transparency is present with small layer thicknesses such as is the case with very thin silver layers having a layer thickness of less than 50 nm, which can then also still be sufficiently electrically conductive. Electrodes can also be formed from a metal TCO combination. Electrodes can also be formed using MgO, CrO or Au for the coloring. The work function of the electrodes can be any desired. A low work function at anodes and a high work function at cathodes is, however, advantageous. The work function of the electrode materials can, however, have an assisting effect due to the use of doped transport layers such as is typical with PIN diodes. A low work function such as with Mg is of advantage for the cathode material and a high work function such as with Au or ITO is of advantage for the anode.

Substrates can be formed from glass or transparent polymers and in this respect a polymer can additionally even be flexibly deformable.

One or more electrodes and the substrate can, however, also be optically opaque. Optically non-transparent substrates can be provided with a reflective metal layer which then simultaneously forms an electrode on which a component can be directly formed.

A layer assisting the work function can be formed between at least one electrode and one component and is preferably formed from a metal, a metal oxide, an alloy, an organic compound or an ionic compound. Examples for suitable elements and chemical compounds which can be used for this purpose are: Ca, Mg, PEDOT:PSS, Cs, LiF, $Cs_2CO_3$. Doped transport layers, carbon nanotubes, metal nanowires, TCOs, graphene or metals with carbon can also be used for this purpose.

An organic electronic component which can be used in the arrangement in accordance with the invention can be formed with a hole transporting layer (HTL), an electron transporting layer (ETL), a hole blocking layer (HBL), an electron blocking layer (EBL), a layer emitting electromagnetic radiation (EML) or a layer absorbing electromagnetic radiation (AL). In this respect, it can be an organic light-emitting diode or an organic photovoltaic element.

In addition, exciton blocking layers can be present and/or the hole transporting layer and/or the electron transporting layer can be doped to increase their conductivity. 2,3,5,6-tetrafluoro-7,7,8,8,-tetracyanoquinodimethanes (F4-TCNQ) (Lit: Chem. Mater. 2010, 22, 3926-3932) or 1,3,4,5,7,8-hexafluoro tetracyano naphtho quinodimethanes (F6-TNAP) (Lit: Chem. Mater. 2010, 22, 3926-3932) can be used for a doping, for example.

If a plurality of components are used in one layer stack, they can have the same functionality, which can be the case, for example, with tandem solar cells or stacked OLEDs. The components can have a plurality of layers of the same function such as is the case with tandem solar cells or stacked OLEDs.

A plurality of components can be arranged over one another with reduced space requirements and be electrically connected. They can be operated independently of one another and the use of different components is also possible whose different functions can naturally also be utilized independently of one another. In this respect, the electrical blocking behavior of a component not electrically controlled in operation can be used.

An electrode which is arranged between two components can electrically now be an anode and now a cathode depending on the electrical connection of at least one of the two components between which it is arranged or formed. This electrode or these electrodes can preferably be optically transparent, which should apply to a selected wavelength interval, preferably from the wavelength spectrum of visible light and/or NIR light or IR light. In this case, the components can preferably be organic light-emitting diodes and/or photovoltaic organic elements or photosensors.

Components arranged above one another and electrically connected to one another in accordance with the invention can naturally also be used in a serial arrangement or in an array arrangement. In this respect, serial arrangements or array arrangements can be used only with components arranged in accordance with the invention or also so that conventional components are operable individually and in addition components arranged above one another in accordance with the invention are present in this respect. It can be sufficient if an arrangement in accordance with the invention is present in a serial arrangement or an array arrangement.

It is moreover advantageous in the invention that less cost-intensive materials (e.g. TCOs, silver, gold) are required from which these electrodes, in particular optically transparent electrodes, have to be manufactured, since an electrode can be used for two components, which also applies accordingly to tandem solar cells and stacked OLEDs.

In addition, insulating passivation layers can be dispensed with, whereby the manufacturing costs can additionally be reduced.

The invention can be used, for example, for monitoring the brightness or light intensity in an environment, for example of a room. A component which is used can for this purpose be an organic photovoltaic element or an organic photosensor. The electrical output voltage or the respective electrical current can be utilized as a measurement signal and in this respect for a control, regulation or generation of a warning signal. For this purpose, an organic solar cell can simultaneously satisfy the function of the electoral energy acquisition and the sensor function. If the electrical power falls on an irradiation with electromagnetic radiation onto a predefinable threshold value, it can be utilized as a signal in order, for example, to switch on an element such as an OLED emitting electromagnetic radiation. The components correspondingly arranged above one another (organic photovoltaic element and element emitting electromagnetic radiation) are operated independently of one another in time.

There is, however, also the possibility of arranging at least two components emitting electromagnetic radiation over one another in accordance with the invention. There is the possibility in this respect of using components which emit electromagnetic radiation of different wavelengths, that is of different colors. At least three color shades can thereby be alternately achieved if the two components are electrically controlled correspondingly sequentially and in this respect one component alone is operated. At least two components emitting electromagnetic radiation of different wavelengths can thus be controlled so that the intensity of the respective emitted radiation is varied. Color shades can thereby be achieved which lie in the wavelength range between the two wavelengths of the radiation emitted by the two components. The two components can in this respect be operated in pulsed form, with one component being switched off, while an electrical current flows over the other component. An influencing of the emitted radiation can in this respect be achieved by the respective length of the switch-on times and the switch-off times of the two components. There is also the possibility, alone or additionally, of varying the respective electrical charge with which the components are operated so that the intensity at which the respective component emits radiation is correspondingly larger or smaller.

The color shades can be influenced by the decaying of the emitted radiation after the switching off of a component, whereas the respective other component has just been switched on and starts the emission of radiation.

The arrangement of components within a stack can be selected practically as desired. A component having a selected functionality can thus be arranged on a substrate, between two components or at the upper end of a stack.

There is, however, also the possibility of changing the polarity of the components as often as desired and at freely selectable time intervals. With fast pole reversals carried out at high frequency, the color point and/or the brightness at which electromagnetic radiation is emitted can be influenced by pulses or by modulation with at least two organic light-emitting diodes arranged above one another. The illuminance of a component can, however, also be adapted to the environmental illuminance. In this respect, organic photovoltaic components with organic light-emitting diodes can preferably be used. An energy-saving regulation is thus possible in the operation of displays or of lighting systems.

BRIEF DESCRIPTION OF THE DRAWINGS

The invention will be explained in more detail by way of example in the following drawings.

There are shown.

DETAILED DESCRIPTION OF THE INVENTION

Figure 1:
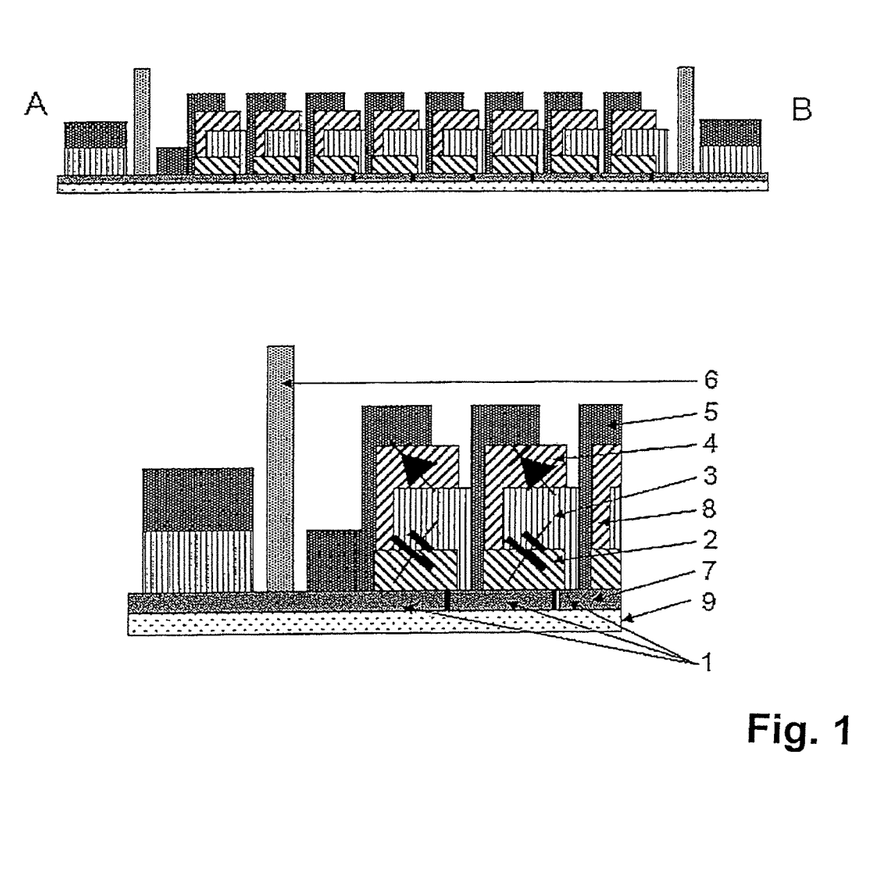
FIG. 1 in schematic form, two arrangements in accordance with the invention which are arranged next to one another and which are each formed in this example with one organic light-emitting diode and one organic solar cell.

In the example shown in FIG. 1, a throughgoing planar potential separator 7 for the electrode 1 is formed on an electrode 1 by laser ablation, etching, structured deposition or by pressure processes. In this respect, a plurality of electrodes 1 are formed next to one another and electrically insulated from one another on the substrate 9. A layer structure which forms an organic solar cell 2 as an organic electronic component 2 is formed on the potential separator 7 spaced apart from one another. An electrode 3 is again formed on the surface of said organic electronic component, said electrode preferably being able to be optically transparent, but also opaque and forming a common electrode 3 with an organic light-emitting diode 4.

A layer system of an organic light-emitting diode is then formed on the surface of this common electrode 3 as a component 4 which is in turn covered by the electrode 3. This electrode is 5 can also be optically transparent or opaque.

The two electrodes 1 and 5 are electrically conductively connected to one another and therefore monopolar.

The two components 2 and 4 in this respect have a PIN-PIN junction behavior.

The arrangements in accordance with the invention arranged next to one another on the electrode 1 can be electrically separate from one another or connected to one another depending on the structuring of the potential separator 7 which is carried out by a laser ablation or by the use of masks in the coating.

Figure 2:
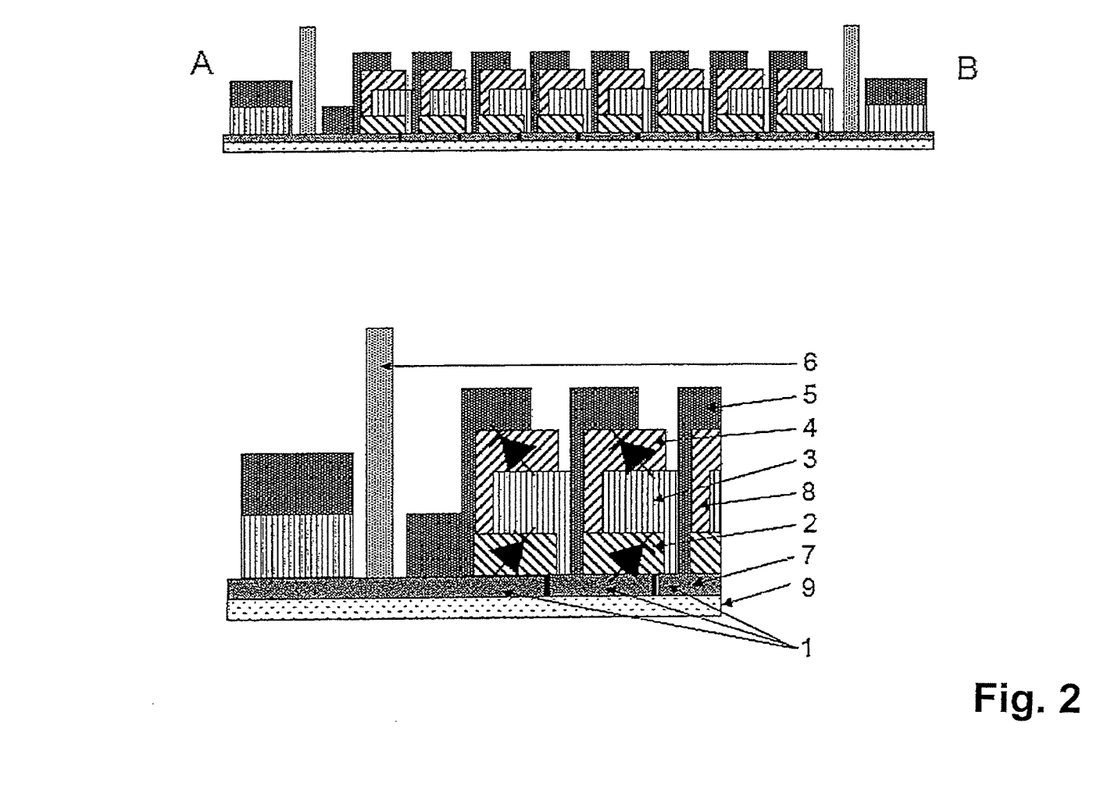
FIG. 2 in schematic form, two arrangements in accordance with the invention which are arranged next to one another and which are each formed in this example with two organic light-emitting diodes arranged above one another.

In FIGS. 1 and 2, an encapsulation margin 6 is moreover drawn which is an element of an encapsulation such as is usual in organic electronic components. In both examples, the lower electrode 1 is optically transparent and is formed from indium tin oxide (ITO).

The example in accordance with FIG. 2 differs from the example in accordance with FIG. 1 in that instead of the organic solar cell 2 a second organic light-emitting diode 8 is formed with its layer structure between the electrodes 1 and 3. The two organic light-emitting diodes 8 and 4 also have a PIN-PIN junction behavior here.

In both Figures and 1 and 2, a structure is shown having a plurality of arrangements which are arranged next to one another and which are each electrically connected in series so that they form a serial arrangement or also, optionally, a two-dimensional array. An array can be formed if in addition arrangements in accordance with the invention can also be arranged in the plane into the drawing or out of the drawing plane and can be connected electrically in series via the common electrode 3.

In an embodiment of an example in accordance with FIG. 1, due to the combination of the two different components 2 and 4, their different functional qualities are utilized as explained in the general part of the description.

It was thus be possible with a monochrome, red organic light-emitting diode 4 in combination with a ZnPc:$C_{60}$ based organic solar cell 2, which is in particular sensitive in the wavelength spectrum of red light, and with correspondingly optically transparent electrodes 3 and 5 to receive an electrical current and in so doing to lower its electrical blocking behavior on an irradiation with electromagnetic radiation from the wavelength spectrum of red light with the organic solar cell 2. The solar cell in this respect changed its electrical conductivity so much that an electrical short-circuit definitely did not occur and the desired functionality of such an example could be observed.

Figure 3:
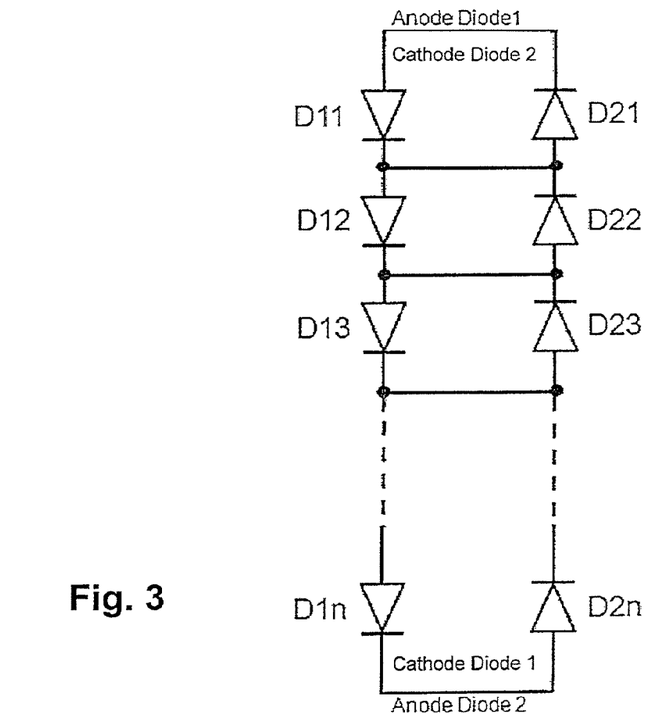
FIG. 3 three electrical equivalent circuit diagrams for examples of arrangements in accordance with the invention.

An electric equivalent circuit diagram for an arrangement in accordance with the invention having two respective components which are arranged in a stack and above one another is shown in FIG. 3.

In this respect, two organic light-emitting diodes (e.g. D1n and D2n), which emit electromagnetic radiation of different wavelengths, are arranged above one another in the z direction. The components D1n and D2n are in this respect electrically connected in parallel. Depending on the selected polarity of the outer contacts, a component is always operated in the blocking direction and therefore does not light up. The light-emitting surfaces of the components D1n and D2n can be connected to one another in any desired number n in series in the x direction or y direction.

The manufacture of an arrangement in accordance with the invention can take place as follows:

Either a conductive layer, e.g. ITO, can already be present or a rigid or flexible substrate (not shown) or such a layer is deposited, e.g. by a sputtering process or PVD process. It then forms an electrode 1. A structuring can e.g. take place using a printing process, using laser ablation or by shadow masks. Subsequently, an OLED or OPV layer stack is deposited, e.g. by PVD, with which a component 2 or 8 is formed as an organic photovoltaic component or as an organic light-emitting diode. It is possible to make use of known layer structures for these organic electronic components. A structuring of these layer structures can e.g. take place by printing processes, deposition using shadow masks in vacuum or by laser ablation. A conductive layer which forms the electrode 3 can be deposited on the OLED or OPV layer stack. This layer can e.g. be deposited by PVD processes or sputtering processes. This electrode is 3 can be made as optically transparent or opaque. FTO, ITO, AZO (electrically conductive oxides TCOs), a metal or an alloy, e.g. Ag, Al, Ca, Mg, Yb, Cu or Au, can be used as the electrically conductive material. Mixtures thereof or also multilayer systems are also possible. A structuring can e.g. take place by deposition through shadow masks. A further layer stack for an organic light-emitting diode or an organic photoelement is deposited on the electrode 3 as component 4 and is structured as before. Finally, a transparent or opaque top electrode 5 is deposited which can preferably comprise FTO, ITO, AZO (electrically conductive oxides), a metal or an alloy such as Ag, Al, Ca, Mg, Yb, Cu or Au. Mixtures or multilayer systems thereof are also possible here. A structuring can e.g. take place by deposition through shadow masks. Last, the arrangement is encapsulated, which can e.g. take place by bonding a top glass or laminating a film. The layer thicknesses for the conductive layers, in particular the electrodes 1, 3 and typically lie at 10 nm to 200 nm. In this respect, the respective electrical conductivity, and optionally the desired optical transparency, can be taken into account.

Graphenes, PEDOT:PSS, silver nanowires or carbon nanotubes can, however, also be used for electrically conductive layers.

Figure 4:
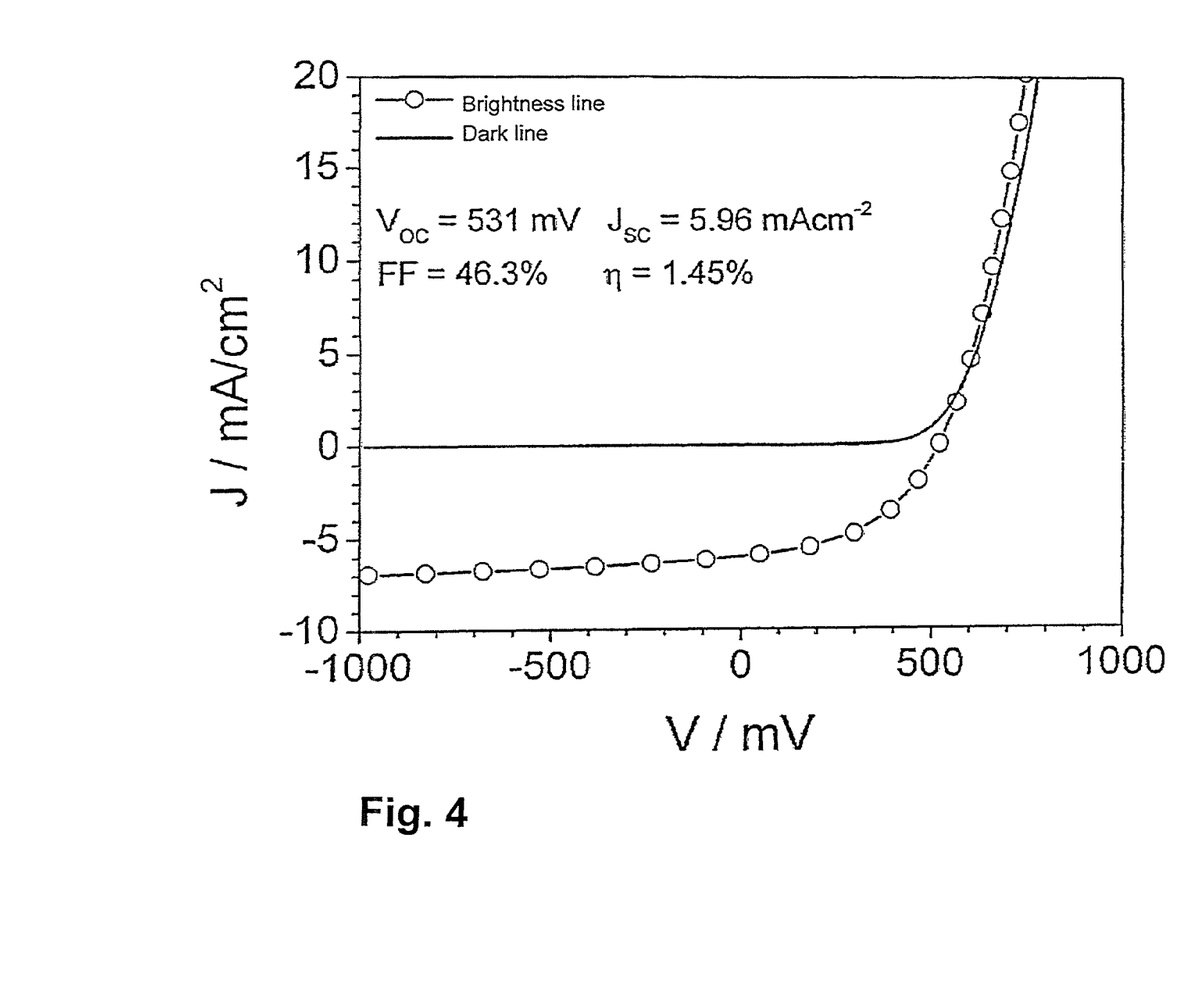
FIG. 4 a diagram of the current-voltage curve (J-V) of an organic solar cell for an arrangement with an OLED and an organic solar cell.

The current-voltage curve (J-V) of an organic solar cell as an organic photovoltaic component on irradiation with AM1.5 (line with symbol) and its dark characteristic (line without symbols) can be seen from the diagram shown in FIG. 4. An efficiency of the active surfaces of 1.45% was determined in this respect.

Figure 5:
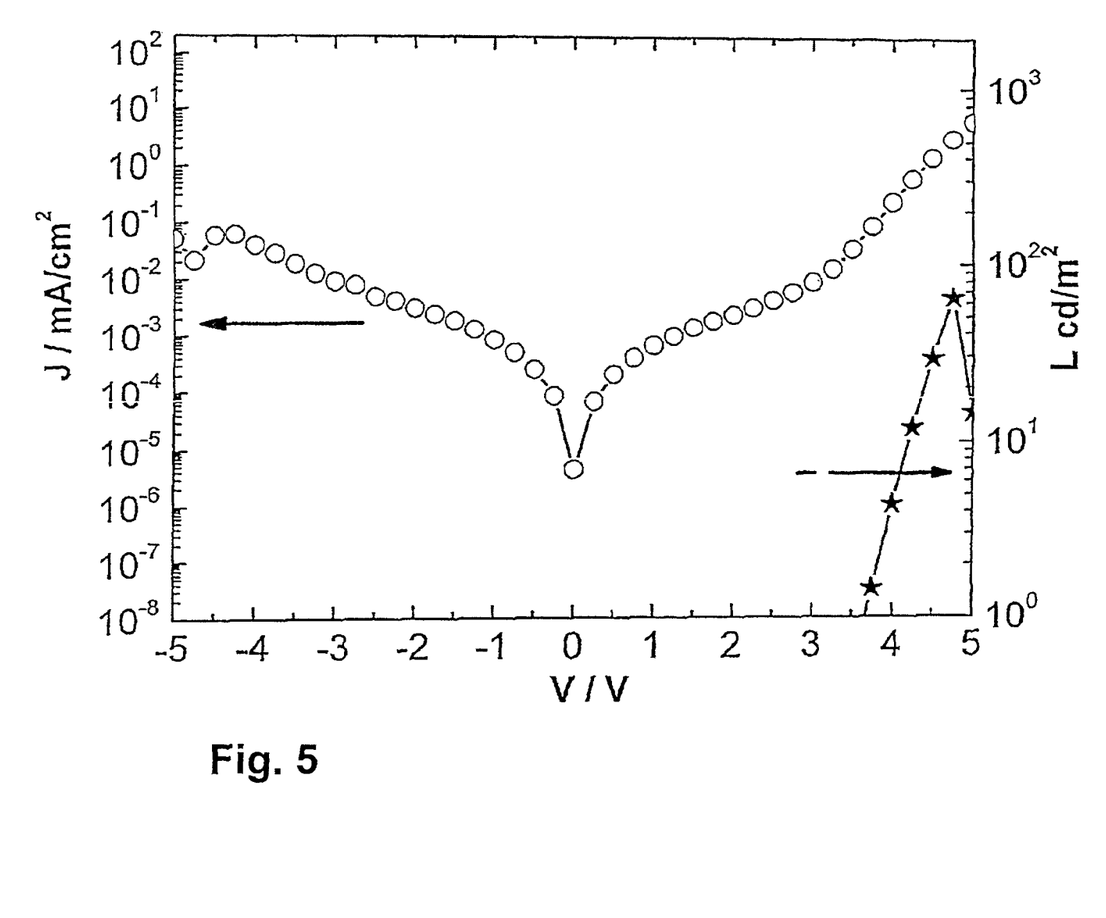
FIG. 5 a diagram of the luminous density/current density/voltage curve for an arrangement having an OLED and an organic LED (L-J-V).

It can be recognized from the diagram shown in FIG. 5 that the one red OLED can be operated separately, although here an organic solar cell as an organic photovoltaic element and an OLED were integrated. In the diagram, the luminance-current density-voltage curve (L-J-V) is shown. Since the ZnPC:C60 based organic solar cell reacts very sensitively to red light, a photocurrent is generated within the organic solar cell by the illuminating OLED, which has the consequence of a lowering of the blocking behavior of this organic solar cell; the blocking effect of the solar cell is nevertheless sufficient to operate the OLED. It starts to light up from a voltage of 3.8 V onward.

The invention claimed is:

1. An arrangement comprising optically transparent and/or functional components, wherein an organic electronic component and at least one further organic or inorganic electronic component are arranged stacked layer-wise over one another on a substrate, wherein planar electrically conductive electrodes are formed at the surfaces of the components so that the components are electrically connected in series and the components are each individually electrically controllable via the electrodes; wherein a common electrode is formed between two components and components arranged next to one another on the substrate are connected in series by means of the common electrodes; and wherein the electrodes, which are each arranged on the two components, have the same polarity which is opposite to the polarity of the common electrode.

2. An arrangement in accordance with claim 1, characterized in that the components have a PIN-PIN or NIP-NIP junction behavior and the function of corresponding diodes, whereby components arranged above one another can be operated independently of one another so that either a component which is arranged beneath a component or a component which is arranged above a component can be operated by an applied electrical voltage.

3. An arrangement in accordance with claim 1, characterized in that with the components connected electrically in series either the components arranged beneath a component or the components arranged above the component can be operated by an applied electrical voltage.

4. An arrangement in accordance with one claim 1, characterized in that different components are arranged above one another.

5. An arrangement in accordance with one claim 1, characterized in that components arranged above one another can be controlled sequentially and/or can be operated in a pulsed or modulated manner.

6. An arrangement in accordance with claim 1, characterized in that components emitting electromagnetic radiation of different wavelengths are arranged above one another.

7. An arrangement in accordance with claim 1, characterized in that an organic electronic component is selected from organic light-emitting elements, organic photovoltaic elements, organic photosensors, organic thermal elements, electrochromic elements and elements for electrowetting and an inorganic electronic component is selected from inorganic light-emitting elements, inorganic photovoltaic elements, inorganic photosensors, thermal elements and LCDs.

8. An arrangement in accordance with claim 1, characterized in that at least two organic electronic components or at least one organic electronic component and one inorganic electronic component each having different functionalities are present.

9. An arrangement in accordance with claim 1, characterized in that one or more electrodes and/or the substrate is/are optically transparent.

10. An arrangement in accordance with claim 1, characterized in that a layer assisting the work function is formed between at least one electrode and a component and is preferably formed from a metal, a metal oxide, an alloy, an organic compound or an ionic compound.

11. An arrangement in accordance with claim 1, characterized in that an organic electronic component is formed with a hole transporting layer (HTL), an electron transporting layer (ER.), a hole blocking layer (HBL), an electron blocking layer (HBL), a layer emitting electromagnetic radiation (EML) or a layer absorbing electromagnetic radiation (AL).

12. An arrangement in accordance with claim 8, characterized in that exiton blocking layers are additionally present and/or the hole transporting layer and/or the electron transporting layer is/are doped to increase their conductivity.

* * * * *